(12) United States Patent
Zhang et al.

(10) Patent No.: US 10,546,779 B2
(45) Date of Patent: Jan. 28, 2020

(54) THROUGH SUBSTRATE VIA (TSV) AND METHOD THEREFOR

(71) Applicant: NXP USA, INC., Austin, TX (US)

(72) Inventors: Qing Zhang, Montreal (CA); Lianjun Liu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/177,673

(22) Filed: Nov. 1, 2018

(65) Prior Publication Data

US 2019/0074220 A1   Mar. 7, 2019

Related U.S. Application Data

(62) Division of application No. 15/335,875, filed on Oct. 27, 2016, now Pat. No. 10,157,792.

(51) Int. Cl.
*H01L 23/48* (2006.01)
*H01L 23/532* (2006.01)
*H01L 21/768* (2006.01)

(52) U.S. Cl.
CPC .. *H01L 21/76898* (2013.01); *H01L 21/76828* (2013.01); *H01L 21/76844* (2013.01); *H01L 21/76879* (2013.01); *H01L 23/481* (2013.01); *H01L 23/5329* (2013.01); *H01L 23/53228* (2013.01); *H01L 21/7684* (2013.01)

(58) Field of Classification Search
CPC ......... H01L 21/76898; H01L 21/76828; H01L 21/76844; H01L 21/76879; H01L 23/481; H01L 23/53228; H01L 23/5329
See application file for complete search history.

(56) References Cited

U.S. PATENT DOCUMENTS

| 5,350,662 A | 9/1994 | Chi | |
|---|---|---|---|
| 2007/0045780 A1* | 3/2007 | Akram | H01L 21/76898 257/621 |
| 2009/0071837 A1* | 3/2009 | Fredenberg | B81C 99/0085 205/131 |
| 2009/0134498 A1 | 5/2009 | Ikeda et al. | |

(Continued)

FOREIGN PATENT DOCUMENTS

| WO | 2011125935 | * 10/2011 |
| WO | 2011125935 A1 | 10/2011 |

OTHER PUBLICATIONS

Henry, D., "Through Silicon Vias Technology for CMOS Image Sensors Packaging", 2008 Electronic Components and Technology Conference, IEEE 2008.

*Primary Examiner* — Joseph M Galvin, III

(57) ABSTRACT

A through substrate via (TSV) and method of forming the same are provided. The method of making the TSV may include etching a via opening into the backside of semiconductor substrate, the via opening exposing a surface of a metal landing structure. A conductive layer is deposited over the backside of semiconductor substrate, sidewalls of the via opening, and exposed surface of the metal landing structure. The conductive layer is coated with a polymer material, filling the via opening. The polymer material is developed to remove the polymer material from the backside of semiconductor substrate, leaving the via opening filled with undeveloped polymer material. A planar backside surface of semiconductor substrate is formed by removing the conductive layer.

20 Claims, 6 Drawing Sheets

(56) References Cited

U.S. PATENT DOCUMENTS

| | | |
|---|---|---|
| 2011/0151659 A1 | 6/2011 | Dao et al. |
| 2011/0240481 A1* | 10/2011 | Keigler ............... H01L 21/2885 205/131 |
| 2012/0098122 A1* | 4/2012 | Yang .................... B81C 1/0023 257/737 |
| 2013/0249047 A1* | 9/2013 | Hung ................ H01L 21/76898 257/506 |

\* cited by examiner

THROUGH SUBSTRATE VIA (TSV) AND METHOD THEREFOR

BACKGROUND

Field

This application is a divisional application of a U.S. patent application entitled "THROUGH SUBSTRATE VIA (TSV) AND METHOD THEREFOR ", having a serial number of 15/335,875, having a filing date of Oct. 27,2016, having common inventors, and having a common assignee, all of which is incorporated by reference in its entirety.

This disclosure relates generally to semiconductor structures, and more specifically, to through substrate vias (TSV) and methods of forming the same.

Related Art

Semiconductor devices are often found in a large spectrum of electronic products—from sewing machines to washing machines, from automobiles to cellular telephones, and so on. These semiconductor devices are typically mounted on a substrate such as a printed circuit board. In order to keep product costs low or to reduce product costs, it is common to minimize the amount of material used within the product, frequently reducing the size of the product itself. As electronic products are reduced in size, printed circuit board real estate becomes more precious putting additional constraints on the size, number, and features of semiconductor devices—pin count, higher integration, package-on-package arrangements, and so on.

Through substrate vias (TSV) provide an alternative to wire bonds and flip chips, allowing semiconductor devices to be formed by vertically stacking two or more semiconductor chips. A TSV is a vertical electrical interconnect that passes through a device wafer or other semiconductor substrate and facilitates electrical connections between two or more vertically stacked wafers and/or chips. However, TSV fabrication is impacted by associated process constraints, complexity, and resulting yield.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
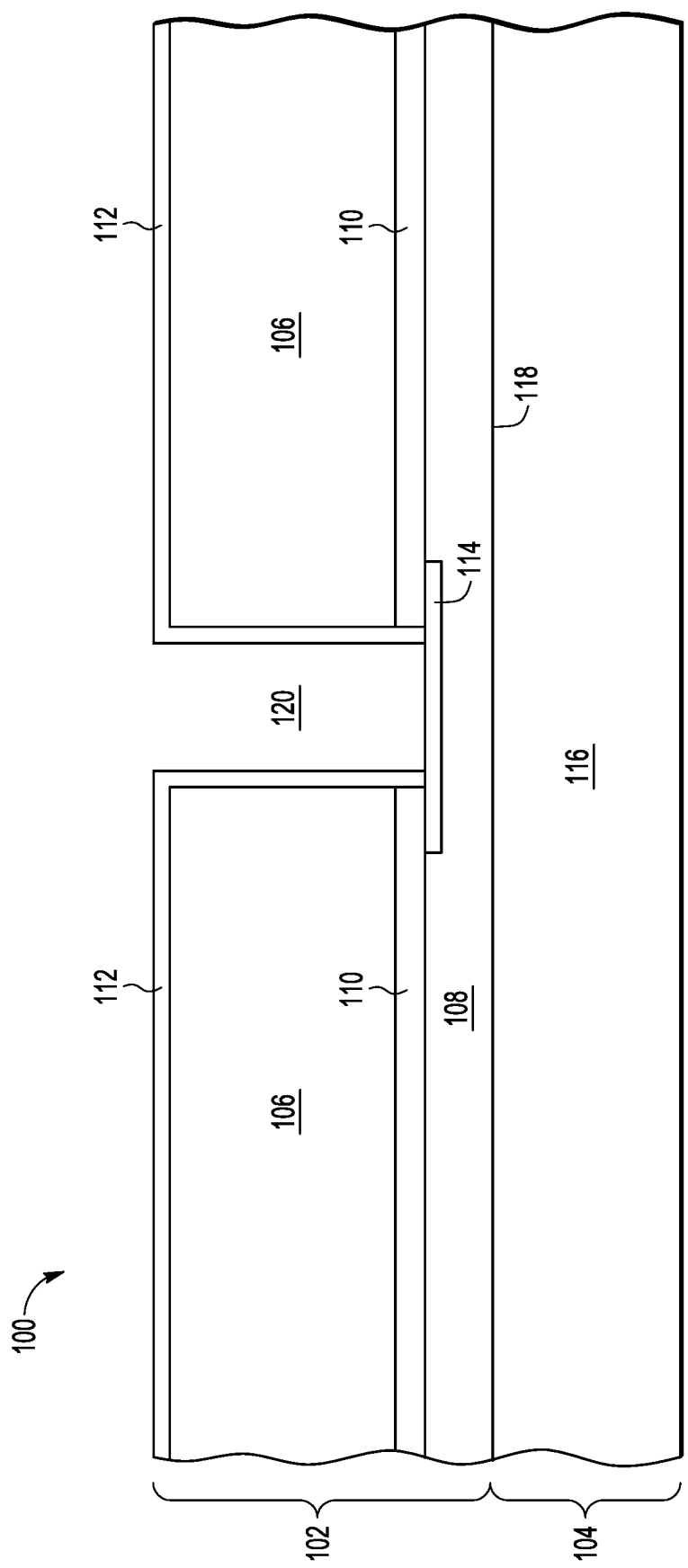
FIG. 1 through FIG. 6 illustrate, in simplified cross-sectional views, various stages of manufacture of an exemplary through substrate via formed in accordance with an embodiment of the present disclosure.

Generally, there is provided, a high aspect ratio through substrate via (TSV) and method of forming the same. After forming a via opening, metallization steps provide electrical connectivity between a backside surface of the semiconductor device and an interconnect or landing pad embedded in an active portion of the semiconductor device. A via plug is then formed with a positive tone photoresist polymer, allowing for a chemical-mechanical planarization (CMP) process to be used to form a planar backside surface of the semiconductor device.

In exemplary embodiments, the via opening is fabricated by forming an opening through a backside of a semiconductor wafer having a plurality of semiconductor devices (e.g., integrated circuit dies) to expose an underlying metal (e.g., aluminum) layer or structure. The via opening is lined with an insulation or dielectric layer, and a metal (e.g., copper) layer by way of an electroplating deposition process. The metal layer is subsequently coated with a positive tone photoresist polymer material, the photoresist polymer material fills remaining portion of the via opening. The exposed portions of the photoresist are removed in a developer process, leaving the remaining portion of the via opening filled with undeveloped photoresist. By removing exposed portions in the developer step, the Cu liner layer is not oxidized as traditionally experienced with an oxide based plasma etch/strip step. The undeveloped photoresist forms a stabilized plug by way of a hard-bake step. The backside surface is prepped for subsequent metallization steps using the CMP process.

The exemplary embodiments can be used to fabricate TSV interconnects in three dimensional (3D) packaging, such as, for example, interposers, wafer level packaging, system in package (SiP) and package on package (PoP) applications, among others.

FIGS. 1-6 illustrate, in simplified cross-sectional views, various stages of manufacture of an exemplary through substrate via (TSV) 100 formed in accordance with an embodiment of the present disclosure. Topside or active surfaces of semiconductor device 102 and sensor device 104 are affixed to one another at interface 118. Bonding pads, conductive posts and seal ring, and the like to form electrical connectivity and hermetic environment between semiconductor device 102 and sensor device 104 are not shown. Semiconductor device 102 may be formed of any suitable semiconductor material or combinations of materials, such as gallium arsenide, silicon germanium, semiconductor-on-insulator (SOI), silicon, monocrystalline silicon, the like, and combinations of the above. Semiconductor device 102 may include analog circuitry, digital circuitry, one or more amplifiers, registers, counters, buffers, interfaces, and the like, or any combination of circuitry and functions, for example. Sensor device 104 may be used for detecting and/or measuring motion, pressure, acceleration, and the like. Sensor device 104 may include one or more micro-electro-mechanical systems (MEMS) formed in a silicon substrate, for example. In some embodiments, sensor device 104 may be a second semiconductor device and include circuitry for detecting and/or measuring temperature, for example.

FIG. 1 illustrates in a simplified cross-sectional view, exemplary TSV 100 at a stage of manufacture in accordance with an embodiment of the present disclosure. Exemplary TSV 100 may be characterized as a high aspect ratio TSV having depth-to-diameter ratios of 8:1 and greater, for example. In this embodiment, TSV 100 may have a depth-to-diameter ratio of 10:1. Semiconductor device 102, depicted as one of a plurality of semiconductor devices of a semiconductor wafer, includes a bulk substrate portion 106 and an active portion 108. For example, the active portion 108 of semiconductor device 102 may include active components, circuitry, and interconnections between input/output terminals, transistors, resistors, capacitors, and the like. A buried dielectric (e.g., oxide) layer 110 is formed between the bulk substrate portion 106 and the active portion 108. As illustrated in FIG. 1, a vertical via opening 120 is etched into the bulk substrate portion 106 from backside of semiconductor device 102. The via etch is initially stopped on the buried dielectric layer 110. The via opening 120 in exemplary embodiments may have depths approximately 100 microns and larger and diameters approximately 10 microns and larger. Subsequently, plasma-enhanced chemical vapor deposition (PECVD) oxide is deposited and etched in repeated cycles to expose a surface of metal landing structure 114 and to form dielectric layer 112 on the via opening sidewalls and backside surface of semiconductor device 102. Metal landing structure 114 may be formed from a variety of electrically conductive materials including, for example, copper, gold, silver, aluminum, nickel, tungsten, and alloys thereof.

Figure 2:
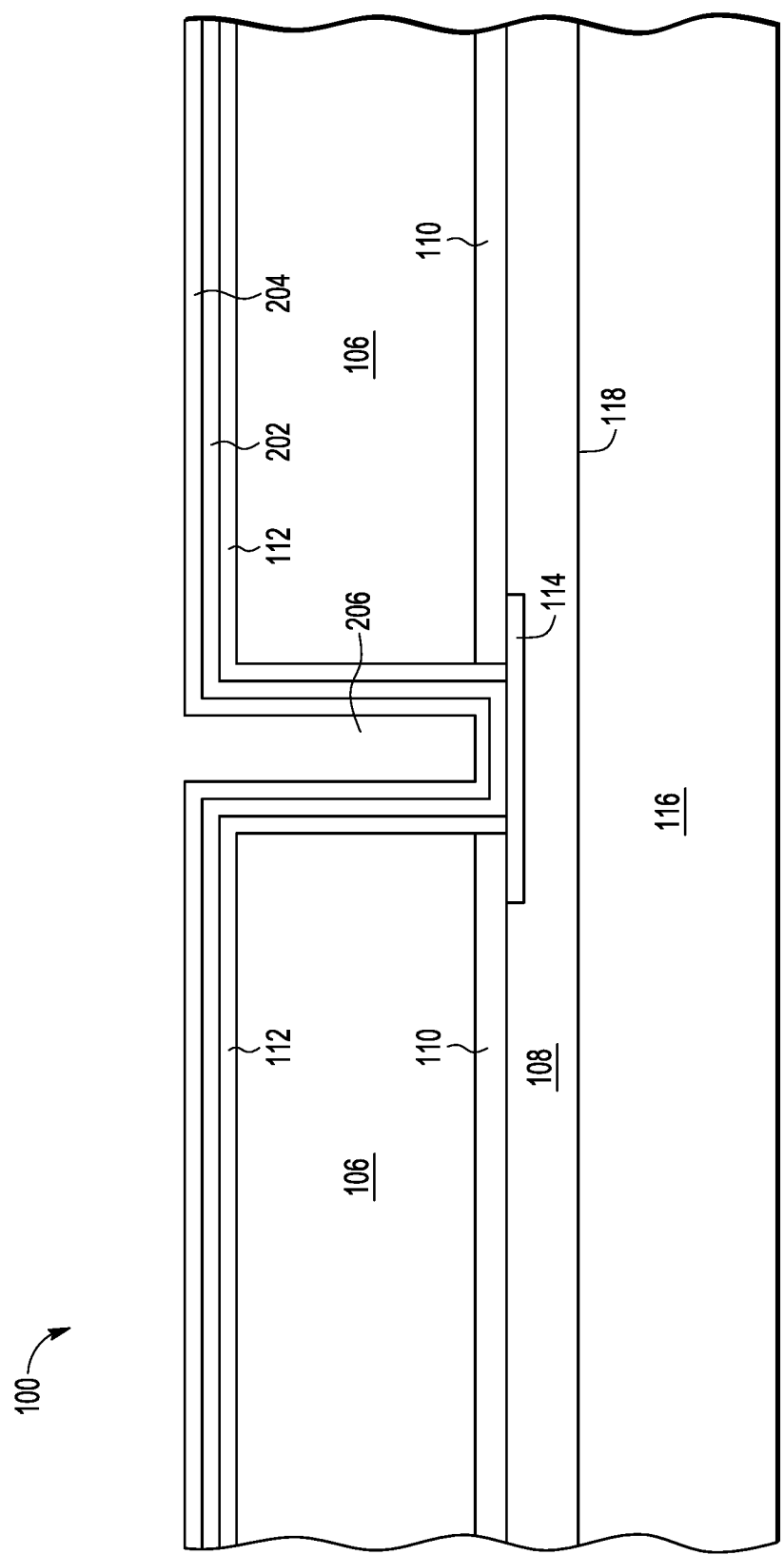

FIG. 2 illustrates in a simplified cross-sectional view, exemplary TSV 100 at a subsequent stage of manufacture in accordance with an embodiment of the present disclosure. After formation of the dielectric layer 112, a barrier layer 202 is deposited by way of an electroless plating process. The barrier layer 202 may include titanium (Ti), titanium nitride (TiN), tantalum (Ta), tantalum nitride (TaN), nickel (Ni), cobalt (Co), boron (B), or any suitable combination of these and other materials. In this embodiment, the barrier layer includes nickel boron (NiB) material and also serves as a seed layer for plating or metallization. A conductive liner layer 204 is deposited over barrier layer 202 by way of an electroplating process. In this embodiment, a copper (Cu) layer is deposited as the liner layer 204 over the barrier layer 202. After deposition of the barrier layer 202 and liner layer 204, a slightly reduced via opening 206 remains.

Figure 3:
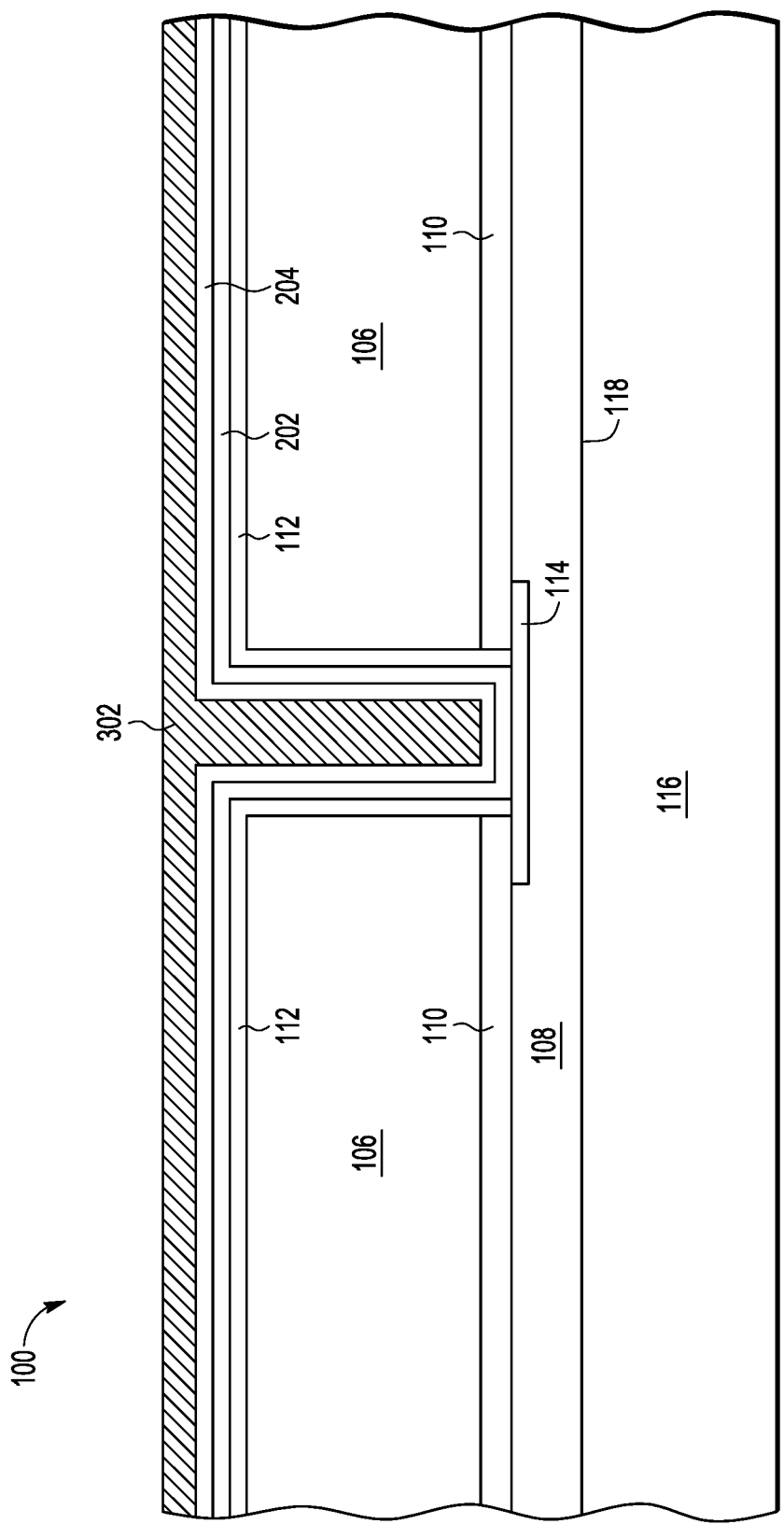

FIG. 3 illustrates in a simplified cross-sectional view, exemplary TSV 100 at a subsequent stage of manufacture in accordance with an embodiment of the present disclosure. After Cu liner layer 204 is deposited over the barrier layer 202, a polymer layer 302 is applied to the backside surface of semiconductor device 102, filling the reduced via opening (206). In this embodiment, a positive tone photoresist polymer (e.g., AZ® P4000 or the like) 302 is spin-coated on the backside surface of semiconductor device 102 and vacuum baked to facilitate photoresist polymer 302 flowing into and filling the reduced via opening (206).

Figure 4:
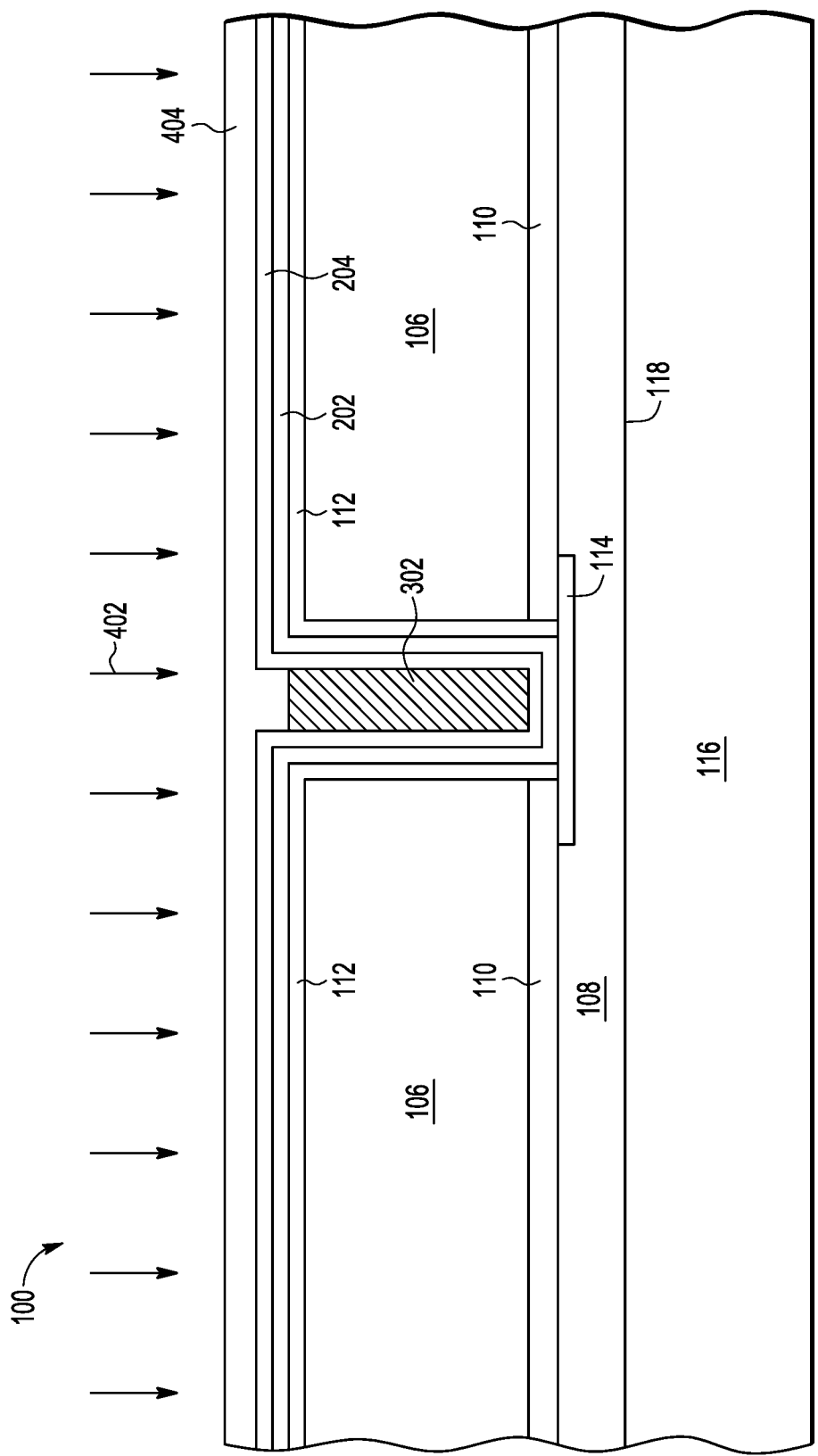

FIG. 4 illustrates in a simplified cross-sectional view, exemplary TSV 100 at a subsequent stage of manufacture in accordance with an embodiment of the present disclosure. As illustrated, the photoresist polymer coated backside surface of semiconductor device 102 is irradiated with ultraviolet (UV) light 402. In this embodiment, the photoresist polymer coating is characterized as a positive tone photoresist. After the photoresist polymer is exposed to UV light 402, the UV exposed photoresist polymer 404 at the backside surface is removed in a developer step. The portion of photoresist polymer 302 which fills the reduced via opening (206) is below developed photoresist 404, and therefore remains undeveloped. In this embodiment, because the positive tone photoresist allowed for removal of UV exposed portions in the developer step, the Cu liner layer is not oxidized as traditionally experienced with an oxide based plasma etch/strip step. The dose and focus of the UV exposure can be adjusted to control the height of photoresist polymer 302 inside the via after develop. The final height of photoresist polymer 302 inside the via should be approximately level with an outer surface of the dielectric layer 112 at the backside surface of semiconductor device 102.

Figure 5:
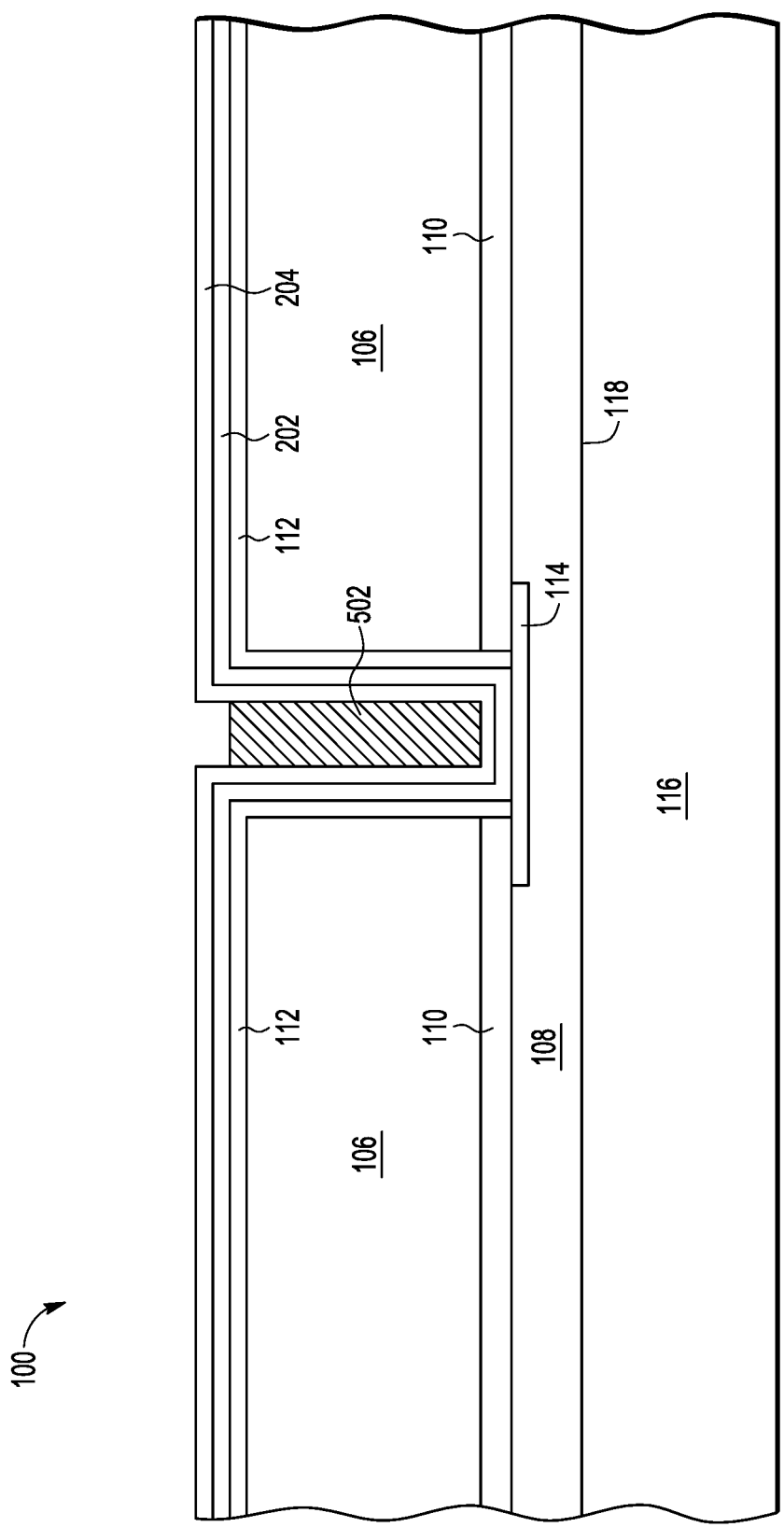

FIG. 5 illustrates in a simplified cross-sectional view, exemplary TSV 100 at a subsequent stage of manufacture in accordance with an embodiment of the present disclosure. After photoresist polymer develop, only the portion of photoresist polymer 302 inside the via remains. The remaining photoresist polymer 302 is hard-baked to cross-link the photoresist polymer forming a permanent via filling material 502. During the hard-bake of photoresist polymer 302, shrinkage of the hard-baked polymer 502 may result from being subjected higher temperatures. Such shrinkage may be anticipated and taken into consideration when determining the dose and focus of the UV exposure to set the height of hard-baked polymer 502. The final height of the hard-baked polymer 502 inside the via should be substantially level with a top surface of the dielectric layer 112 at the backside surface of semiconductor device 102.

Figure 6:
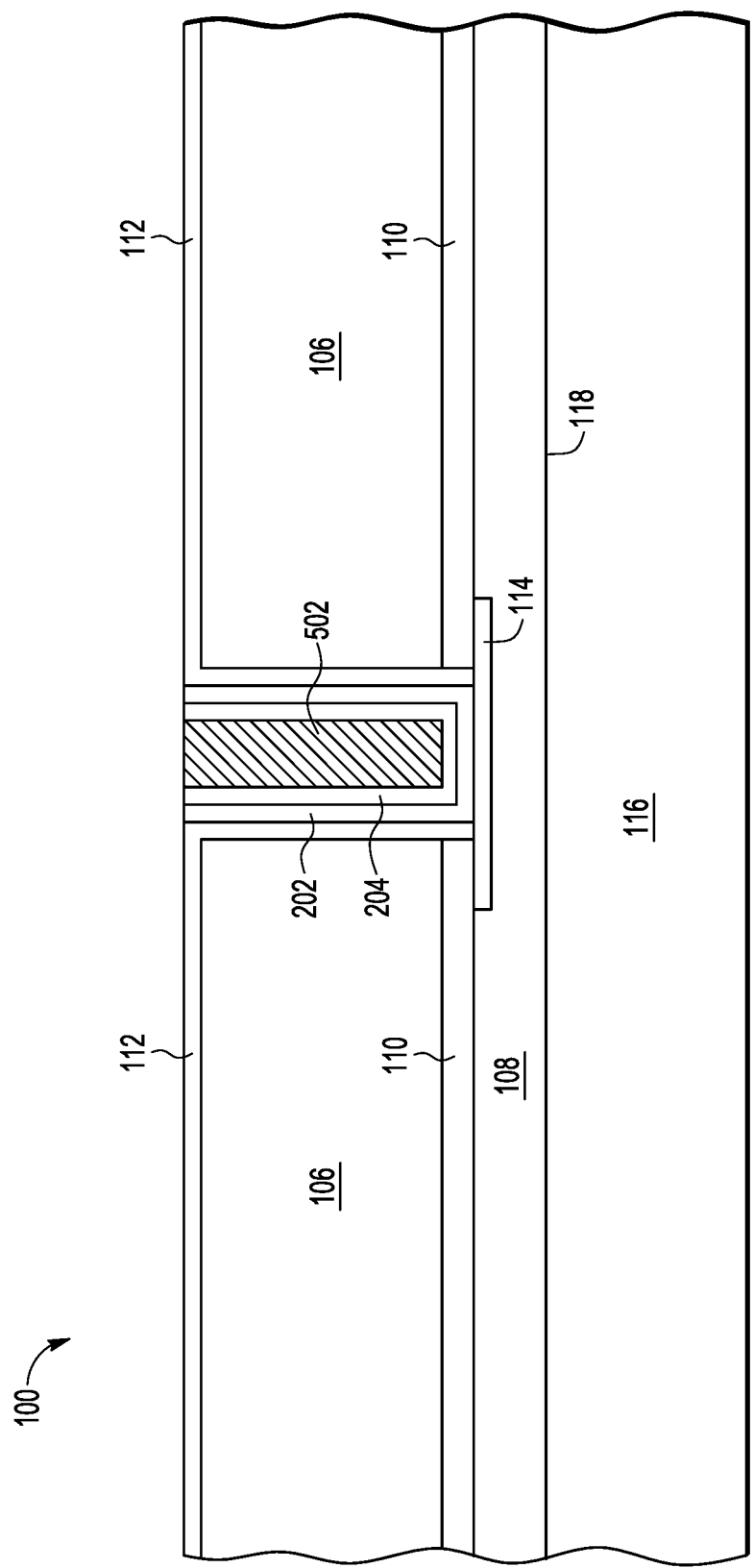

FIG. 6 illustrates in a simplified cross-sectional view, exemplary TSV 100 at a subsequent stage of manufacture in accordance with an embodiment of the present disclosure. After hard-baking the remaining photoresist polymer 302 to form a permanent via filling material 502, the Cu and NiB layers at the backside surface of semiconductor device 102 are removed. A chemical-mechanical planarization (CMP) process is used to remove the Cu and NiB layers, keeping the dielectric layer 112 intact. After the CMP step, a planar surface results across the backside surface of semiconductor device 102 allowing for subsequent metallization steps interconnecting the exemplary TSV 100.

Generally, there is provided, a method of forming a through substrate via (TSV) in a semiconductor substrate, including etching a vertical via opening into the backside of semiconductor substrate, the via opening exposing a surface of an embedded metal landing structure; depositing a conductive layer over the backside of semiconductor substrate, sidewalls of the via opening, and exposed surface of the metal landing structure; coating the conductive layer with a photoresist polymer material, the photoresist polymer material filling remaining portion of the via opening; developing the photoresist polymer material to remove the photoresist polymer material from the backside of semiconductor substrate and leaving the remaining portion of the via opening substantially filled with undeveloped photoresist polymer material; and forming a planar backside surface of semiconductor substrate by removing the conductive layer deposited over the backside of semiconductor substrate. The method may further include forming a barrier layer between the semiconductor substrate and the conductive layer. The barrier layer may include nickel boron (NiB) material and may serve as a seed layer. Depositing a conductive layer may include electroplating copper (Cu) on the barrier layer. The method may further include irradiating the photoresist polymer material with ultraviolet (UV) light at the backside of semiconductor substrate. The photoresist polymer material may be characterized as a positive tone photoresist polymer material. The method may further include hard-baking the undeveloped photoresist polymer material to cross-link the photoresist polymer material. Forming a planar backside surface of semiconductor substrate may include forming a planar backside surface by removing conductive and barrier layers using a chemical-mechanical planarization (CMP) process. The metal landing structure may include a copper (Cu) or aluminum (Al) material.

In another embodiment, there is provided, a method of forming a through substrate via (TSV) in a semiconductor substrate, including etching a vertical via opening into the backside of semiconductor substrate, the via opening exposing a surface of an embedded metal landing structure; depositing a dielectric layer over the backside of semiconductor substrate and sidewalls of the via opening; depositing a conductive layer over the dielectric layer and exposed surface of the metal landing structure; coating the conductive layer with a photoresist polymer material, the photoresist polymer material filling remaining portion of the via opening; developing the photoresist polymer material to remove the photoresist polymer material from the backside of semiconductor substrate and leaving the remaining portion of the via opening substantially filled with undeveloped photoresist polymer; and using a chemical-mechanical planarization (CMP) process to remove conductive layer over the backside of semiconductor substrate, leaving underlying dielectric layer substantially intact. The vertical via opening may be characterized as a high aspect ratio via opening having a depth-to-diameter ratio of substantially 8:1 or greater. The method may further include forming a barrier layer between the dielectric layer and the conductive layer. The barrier layer may include nickel boron (NiB) material and may serve as a seed layer. Depositing a conductive layer may include electroplating copper (Cu) on the barrier layer. The photoresist polymer material may be characterized as a positive tone photoresist polymer material. The method may further include hard-baking the undeveloped photoresist polymer material to cross-link the photoresist polymer material.

In yet another embodiment, there is provided, a semiconductor device including a semiconductor substrate having an active side and a backside; a metal landing structure embedded in the active side; a via opening formed in the backside of the semiconductor substrate, the via opening exposing a surface of the metal landing structure; a conductive layer formed over the sidewalls of the via opening and exposed surface of the metal landing structure; and a photoresist polymer material disposed within the via opening, a surface of the photoresist polymer in the same plane as a surface of the backside of the semiconductor substrate. The via opening may be characterized as a high aspect ratio via opening having a depth-to-diameter ratio of substantially 8:1 or greater. The conductive layer may include a copper (Cu) material. The photoresist polymer material may be characterized as hard-baked positive tone photoresist polymer material.

By now it should be appreciated that there has been provided, a high aspect ratio through substrate via (TSV) and method of forming the same. After forming a via opening, metallization steps provide electrical connectivity between a backside surface of the semiconductor device and an interconnect or landing pad embedded in an active portion of the semiconductor device. A via plug is then formed with a positive tone photoresist polymer, allowing for a chemical-mechanical planarization (CMP) process to be used to form a planar backside surface of the semiconductor device.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
   a semiconductor substrate having an active side and a backside;
   a metal landing structure embedded in the active side;
   a via opening formed in the backside of the semiconductor substrate, the via opening exposing a surface of the metal landing structure;
   a conductive layer formed over the sidewalls of the via opening and exposed surface of the metal landing structure; and
   a photoresist polymer material disposed within the via opening, the photoresist polymer unexposed to ultraviolet (UV) light and undeveloped, a surface of the photoresist polymer in the same plane as a surface of the backside of the semiconductor substrate.

2. The semiconductor device of claim 1, wherein the via opening is characterized as a high aspect ratio via opening having a depth-to-diameter ratio of substantially 8:1 or greater.

3. The semiconductor device of claim 1, wherein the conductive layer comprises a copper (Cu) material.

4. The semiconductor device of claim 1, wherein the photoresist polymer material is characterized as hard-baked positive tone photoresist polymer material.

5. The semiconductor device of claim 1, further comprising a barrier layer disposed between the semiconductor substrate and the conductive layer.

6. The semiconductor device of claim 2, wherein the barrier layer includes nickel boron (NiB) material.

7. The semiconductor device of claim 1, wherein the metal landing structure comprises a copper (Cu) or aluminum (Al) material.

8. The semiconductor device of claim 1, wherein the backside of the semiconductor substrate is formed as a planar backside surface by removing a portion of the conductive layer using a chemical-mechanical planarization (CMP) process.

9. A semiconductor device, comprising:
   a semiconductor substrate having an active side and a backside;
   a metal landing structure embedded in the active side;
   a via opening formed in the backside of the semiconductor substrate, the via opening exposing a surface of the metal landing structure;
   a conductive layer formed over the sidewalls of the via opening and exposed surface of the metal landing structure; and
   a cross-linked photoresist polymer material disposed within the via opening, the photoresist polymer unexposed to ultraviolet (UV) light and undeveloped, a surface of the photoresist polymer in the same plane as a surface of the backside of the semiconductor substrate.

10. The semiconductor device of claim 9, wherein the cross-linked photoresist polymer material is characterized as hard-baked positive tone photoresist polymer material.

11. The semiconductor device of claim 9, further comprising a barrier layer disposed between the semiconductor substrate and the conductive layer.

12. The semiconductor device of claim 11, wherein the barrier layer includes nickel boron (NiB) material.

13. The semiconductor device of claim 11, wherein the conductive layer comprises electroplated copper (Cu) formed on the barrier layer.

14. The semiconductor device of claim 9, wherein the metal landing structure comprises a copper (Cu) or aluminum (Al) material.

15. The semiconductor device of claim 9, wherein the backside of the semiconductor substrate is formed as a planar backside surface by way of removing a portion of the conductive layer using a chemical-mechanical planarization (CMP) process.

16. The semiconductor device of claim 9, wherein the via opening is characterized as a high aspect ratio via opening having a depth-to-diameter ratio of substantially 8:1 or greater.

17. A semiconductor device, comprising:
a semiconductor substrate having an active side and a backside, the backside having a planar surface;
a metal landing structure embedded in the active side;
a via opening formed in the backside of the semiconductor substrate, the via opening exposing a surface of the metal landing structure;
a conductive layer formed over the sidewalls of the via opening and exposed surface of the metal landing structure; and
a hard-baked photoresist polymer material disposed within the via opening, the photoresist polymer unexposed to ultraviolet (UV) light and undeveloped, a surface of the photoresist polymer in the same plane as the planar surface of the backside of the semiconductor substrate.

18. The semiconductor device of claim 17, wherein the metal landing structure comprises a copper (Cu) or aluminum (Al) material.

19. The semiconductor device of claim 17, further comprising a barrier layer disposed between the semiconductor substrate and the conductive layer.

20. The semiconductor device of claim 19, wherein the conductive layer comprises electroplated copper (Cu) formed on the barrier layer.

* * * * *